United States Patent
Chen et al.

(10) Patent No.: US 6,987,322 B2
(45) Date of Patent: Jan. 17, 2006

(54) CONTACT ETCHING UTILIZING MULTI-LAYER HARD MASK

(75) Inventors: Yi-Nan Chen, Taipei (TW); Hui-Min Mao, Taipei (TW)

(73) Assignee: Nanya Technology Corporation, Taoyuan (TW)

(*) Notice: Subject to any disclaimer, the term of this patent is extended or adjusted under 35 U.S.C. 154(b) by 7 days.

(21) Appl. No.: 10/923,591

(22) Filed: Aug. 20, 2004

(65) Prior Publication Data

US 2005/0275107 A1 Dec. 15, 2005

(30) Foreign Application Priority Data

Jun. 9, 2004 (TW) .......................... 93116520 A

(51) Int. Cl.
*H01L 23/48* (2006.01)

(52) U.S. Cl. .................. 257/758; 257/750; 257/751; 257/756; 257/797

(58) Field of Classification Search .............. 257/750, 257/751, 756, 758, 797
See application file for complete search history.

(56) References Cited

U.S. PATENT DOCUMENTS

| | | | |
|---|---|---|---|
| 6,140,226 A | * 10/2000 | Grill et al. | 438/637 |
| 6,479,391 B2 | 11/2002 | Morrow et al. | |
| 6,514,852 B2 | * 2/2003 | Usami | 438/624 |
| 6,774,439 B2 | * 8/2004 | Fukuzumi et al. | 257/360 |
| 2004/0175926 A1 | * 9/2004 | Wang et al. | 438/627 |
| 2005/0042871 A1 | 2/2005 | Tzou et al. | |

FOREIGN PATENT DOCUMENTS

| | | | |
|---|---|---|---|
| JP | 03138920 A | * | 6/1991 |
| TW | 589708 | | 6/2004 |

* cited by examiner

*Primary Examiner*—Tom Thomas
*Assistant Examiner*—Matthew E. Warren
(74) *Attorney, Agent, or Firm*—Quintero Law Office

(57) ABSTRACT

A method for forming contact holes using a multi-layer hard mask. A substrate with a device region and an alignment region having an opening therein to serve as an alignment mark is provided. A dielectric layer is formed overlying the substrate and fills the opening, followed by the multi-layer hard mask. The multi-layer hard mask over the opening is partially removed and that on the device region is patterned to form a plurality of holes therein and expose the underlying dielectric layer. The exposed dielectric layer on the device region is etched to form the plurality of contact holes therein.

8 Claims, 4 Drawing Sheets

CONTACT ETCHING UTILIZING MULTI-LAYER HARD MASK

BACKGROUND

The present invention relates to a semiconductor process and in particular to fabrication of a semiconductor device using a multi-layer hard mask.

The increasing demand for highly integrated and high-performance semiconductor devices has fueled the need for advances in integrated circuit manufacturing technology. To produce an integrated circuit with high integration density, the sizes of semiconductor devices and interconnects must be narrowed. Lithography and etching must be performed to form trenches and contact holes in the dielectric layer prior to the formation of the interconnects. Thereafter, the trenches and contact holes are filled with a metal layer and followed by polishing to complete the fabrication. This is a typical damascene process in semiconductor manufacturing technology. In a common etching technique used to form openings, such as trenches or contact holes, in a target layer on a substrate, a photoresist pattern is formed on the target layer to serve as an etch mask. Since the thickness of the photoresist pattern can dictate the etching rate, the photoresist pattern must be thick if the contact holes are to be very small.

A photoresist layer having a thickness of 3000 Å or more, however, is not sensitive to the light used for lithography. That is, it is difficult to form a contact hole with a small critical dimension using a photoresist layer as an etch mask. Accordingly, the fabrication of a contact hole with small critical dimension using a polysilicon layer as an etch mask has been widely employed.

FIG. 1 is a cross-section showing a conventional semiconductor device fabricated using a single polysilicon hard mask. The semiconductor device comprises a substrate 100, an interlayer dielectric (ILD) layer 112, a polysilicon hard mask 114, a barrier layer 116, and a metal layer 118. The substrate 100 comprises a device region 10 and an alignment region 20, in which the device region 10 has a plurality of gate structures 107 formed thereon and the alignment region 20 has an opening 101 formed in the substrate 100 to serve as an alignment mark (AM). The gate structure 107 comprises a gate dielectric layer 102, a gate electrode 104, and a gate spacer 106. The ILD layer 112 overlies the substrate 100, and the portion thereof over the device region 10 has a bit line contact hole ($C_B$) 113a, a gate contact hole ($C_G$) 113b, and a substrate contact hole ($C_S$) 113c therein. The portion of ILD layer 112 on the alignment region 20 has an opening therein to expose the opening 101. The polysilicon hard mask 114 is disposed on the ILD layer 112 and the portion thereof over the device region 10 has a plurality of holes to expose the bit line contact hole 113a, the gate contact hole 113b, and the substrate contact hole 113c and that the portion over the alignment region 20 has an opening therein to expose the opening (alignment mark) 101. The barrier layer 116 comprising titanium nitride, is conformably disposed on the polysilicon hard mask 114 and the inner surfaces of the contact holes 113a, 113b, and 113c and the opening 101. The metal layer 118, such as a tungsten layer, is conformably formed on the barrier layer 116 and the opening 101 and fills the contact holes 113a, 113b, and 113c.

During the fabrication of this semiconductor device, the alignment mark 101 on the alignment region 20 may fail due to light strongly reflected from the thicker polysilicon hard mask 114. That is, it is difficult to define the contact holes 113a, 113b, and 113c during lithography. In order to solve this problem, the polysilicon hard mask 114 over the alignment mark 101 must be removed prior to definition of the contact holes 113a, 113b, and 113c. As a result, a deeper and wider opening is formed by removing the ILD layer 112 over the alignment mark 101 during definition of the contact holes 113a, 113b, and 113c. As the subsequent metal layer 118 is filled for the fabrication of contact plugs, the deeper and wider opening cannot be completely filled with the metal layer 118. The metal layer 118, however, is conformably formed on the inner surface of the opening. A dishing effect occurs during planarization by chemical mechanical polishing (CMP). As a result, the metal layer 118 adjacent to the alignment mark 118 is disconnected, as depicted by the arrows 119 shown in FIG. 1, thus reducing device reliability.

SUMMARY

An embodiment of the invention provides a method for forming contact holes using a multi-layer hard mask. A substrate with a device region and an alignment region having an opening therein to serve as an alignment mark is provided. A dielectric layer is formed overlying the substrate and fills the opening. A first polysilicon layer, a silicon oxide layer, and a second polysilicon layer are successively formed overlying the dielectric layer to serve as the multi-layer hard mask. The second polysilicon layer over the opening on the alignment region is removed to expose the underlying silicon oxide layer. The multi-layer hard mask on the device region is patterned to form a plurality of holes therein and expose the underlying dielectric layer. The exposed dielectric layer and the silicon oxide layer over the opening is etched using the patterned multi-layer hard mask as an etch mask, to form the plurality of contact holes in the dielectric layer on the device region and expose the first polysilicon layer over the opening on the alignment region.

The first polysilicon layer has a thickness less than the second polysilicon layer. Moreover, the contact hole may comprise a bit line contact hole, a gate contact hole, or a substrate contact hole.

An embodiment of the invention also provides a semiconductor device fabricated using, a multi-layer hard mask. The device comprises a substrate, a dielectric layer, a first polysilicon layer, a silicon oxide layer, a second polysilicon layer, a barrier layer, and a metal layer. The substrate has a device region and an alignment region, in which the alignment region has a first opening therein to serve as an alignment mark. The dielectric layer overlies the substrate and fills the first opening, wherein the dielectric layer on the device region has a plurality of contact holes therein. The first polysilicon layer, the silicon oxide layer, and the second polysilicon layer are successively disposed on the dielectric layer to serve as the multi-layer hard mask, wherein the multi-layer hard mask on the device region has a plurality of holes therein to expose the contact holes and the multi-layer hard mask over the first opening on the alignment region has a second opening therein to expose the first polysilicon layer. The barrier layer is conformably disposed on the multi-layer hard mask and the inner surfaces of the contact holes and the second opening. The metal layer is disposed on the barrier layer and fills the contact holes and the second opening.

The first polysilicon layer has a thickness less than the second polysilicon layer. Moreover, the contact hole may comprise a bit line contact hole, a gate contact hole, or a substrate contact hole.

BRIEF DESCRIPTION OF THE DRAWINGS

Embodiments of the invention will become more fully understood from the detailed description given hereinbelow and the accompanying drawings, given by way of illustration only and thus not intended to be limitative of the invention.

DETAILED DESCRIPTION

Figure 1:
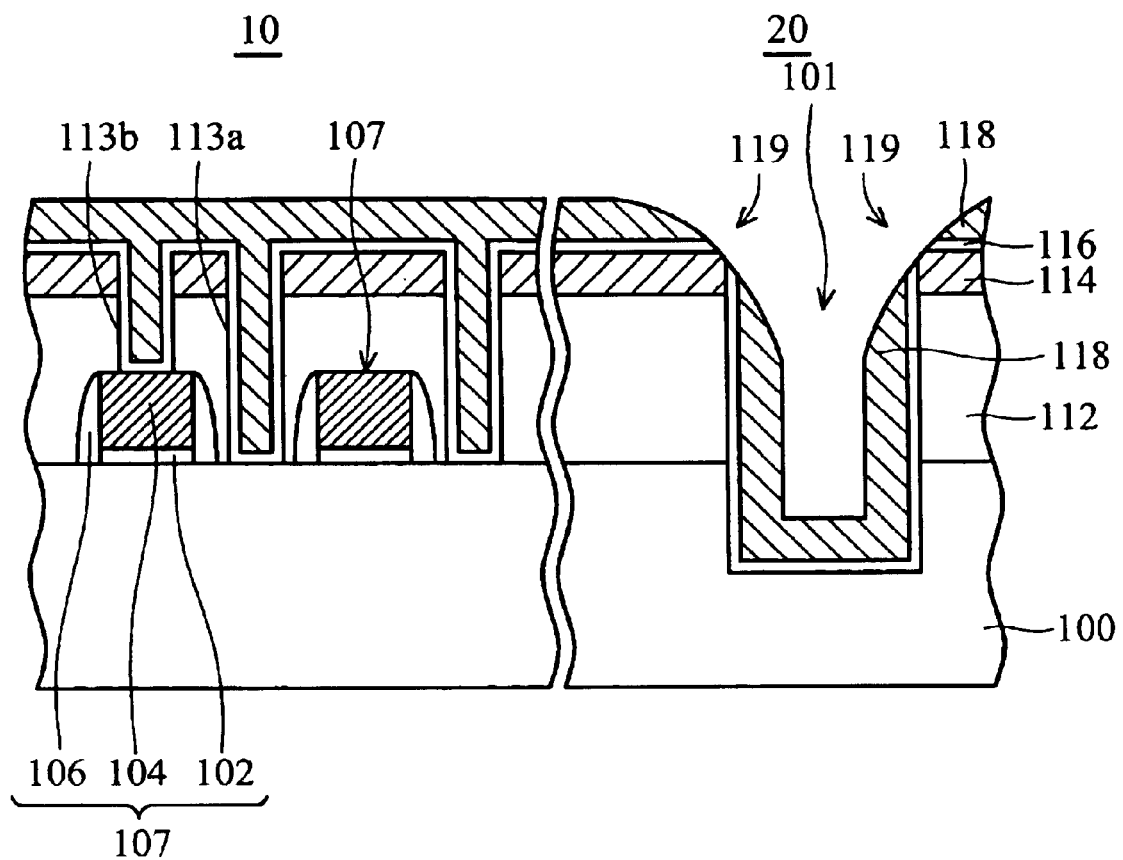
FIG. 1 is a cross-section of a conventional semiconductor device fabricated using a single polysilicon hard mask.
Figure 2A:
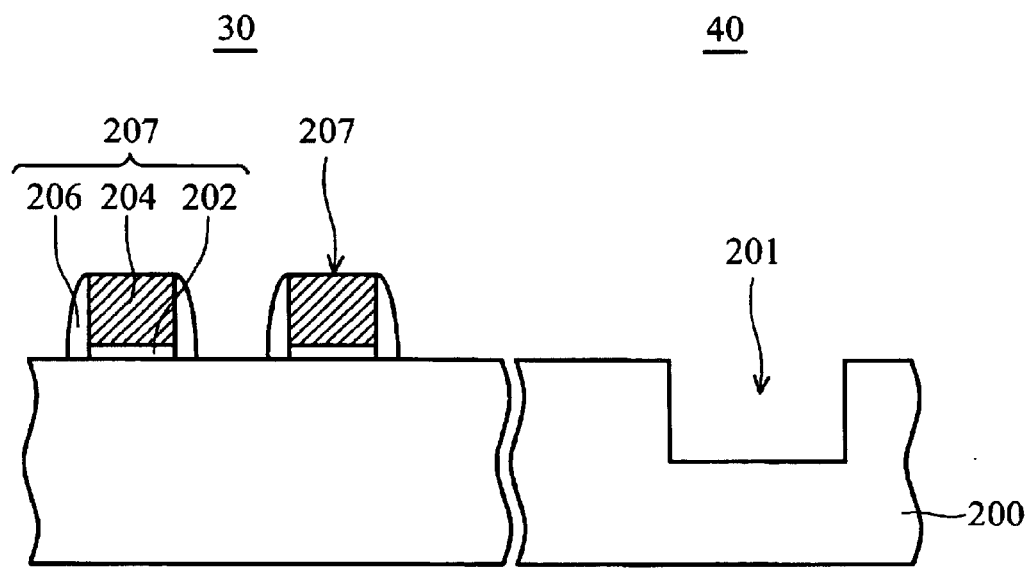
FIGS. 2A to 2E are cross-sections showing a method for forming contact plugs using a multi-layer hard mask of an embodiment of the invention.

First, in FIG. 2A, a substrate 200 for the fabrication of a semiconductor memory device is provided. For example, the substrate 200 may be a silicon substrate or other semiconductor substrates. In this embodiment, the substrate 200 has a device region 30, such as an array region or peripheral circuit region, and an alignment region 40. The device region 30 has a plurality of gate structures 207 formed thereon and the alignment region 40 has an opening 201 therein to serve as an alignment mark (AM). Moreover, the gate structure 207 comprises a gate dielectric layer 202, a gate electrode 204, and a gate spacer 206.

Figure 2B:
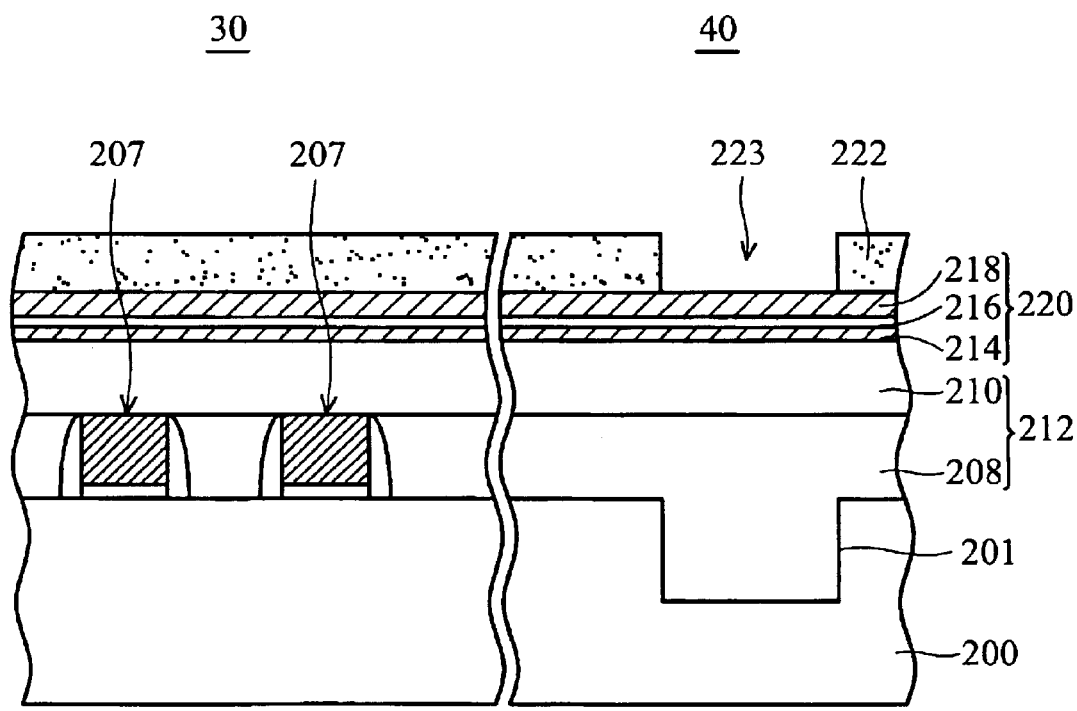

Next, in FIG. 2B, a dielectric layer 212 is deposited overlying the substrate 200 to serve as an interlayer dielectric (ILD) layer, which covers the gate structures 207 on the device region 30 and fills the opening 201 on the alignment region 40. The ILD layer 212 may be a single layer or multiple layers. For example, the ILD layer 212 may comprise a borophosphosilicate glass (BPSG) layer and a tetraethyl orthosilicate (TOES) oxide layer. In this embodiment, the ILD layer 212 is formed by the following steps. First, a BPSG layer 208 blankly covers the gate structures 207 on the device region 30 and fills the opening 201 on the alignment region 40. Next, the excess BPSG layer 208 over the gate structures 207 is removed by chemical mechanical polishing (CMP). Thereafter, a TEOS oxide layer 210 is formed on the polished BPSG layer 208 by conventional deposition, such as chemical vapor deposition (CVD).

As mentioned above, if the polysilicon hard mask is too thick, the alignment mark for subsequent lithography may fail due to light strongly reflected from the hard mask. Conversely, if the polysilicon hard mask is not thick enough, the subsequent etching may suffer. Accordingly, a key feature of this embodiment is to successively form a first polysilicon layer 214, a silicon oxide layer 216, and a second polysilicon layer 218 overlying the ILD layer 212 to serve as a multi-layer hard mask 220 for subsequent etching. The first and second polysilicon layers 214 and 218 may be formed by conventional deposition, such as CVD. Moreover, the first polysilicon layer 214 has a thickness less than the second polysilicon layer 218. For example, the first polysilicon layer 214 has a thickness of about 300 to 500 Å and the second polysilicon layer 218 has a thickness of about 400 to 600 Å. Moreover, the silicon oxide layer 216 may be formed by thermal oxidation or CVD, which has a thickness of about 100 to 200 Å. Next, a photoresist pattern layer 222 is formed on the multi-layer hard mask 220, which has an opening 223 therein to expose the second polysilicon layer 218 over the opening 201 on the alignment region 40.

Figure 2C:
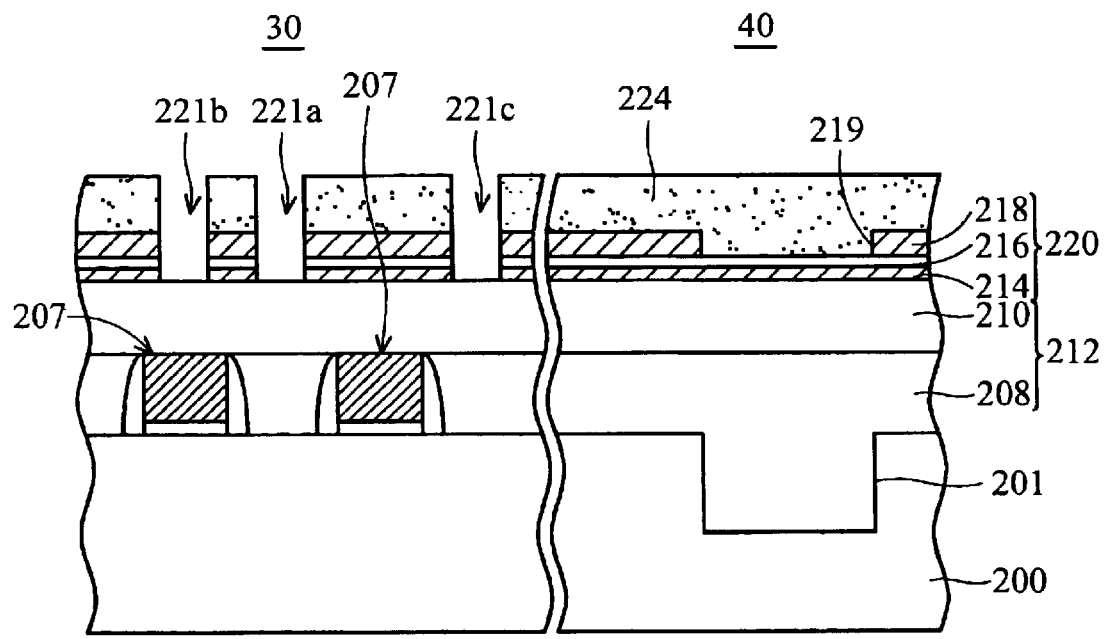

Next, in FIG. 2C, the second polysilicon layer 218 under the opening 223 is removed to form an opening 219 over the alignment mark 201 and expose the underlying silicon oxide layer 216. The photoresist pattern layer 222 which is no longer needed is subsequently removed. The thickness of the multi-layer hard mask 220 over the alignment mark 201 is reduced due to the removal of the second polysilicon layer 218. Accordingly, the strongly reflected light can be prevented during subsequent lithography for the definition of contact holes.

Thereafter, another photoresist pattern layer 224 is formed on the multi-layer hard mask 220, which has a plurality of holes 221a, 221b, and 221c therein and on the device region 30. Next, the multi-layer hard mask 220 is patterned by etching using the photoresist pattern layer 224 as an etch mask, thereby transferring the holes 221a, 221b, and 221c into the multi-layer hard mask 220 to expose the underlying ILD layer 212 for subsequent contact etching. For example, the hole 221a is used for the definition of a bit line contact hole ($C_B$). The hole 221b is used for the definition of a gate contact hole ($C_G$). The hole 221c is used for the definition of a substrate contact hole ($C_S$).

Figure 2D:
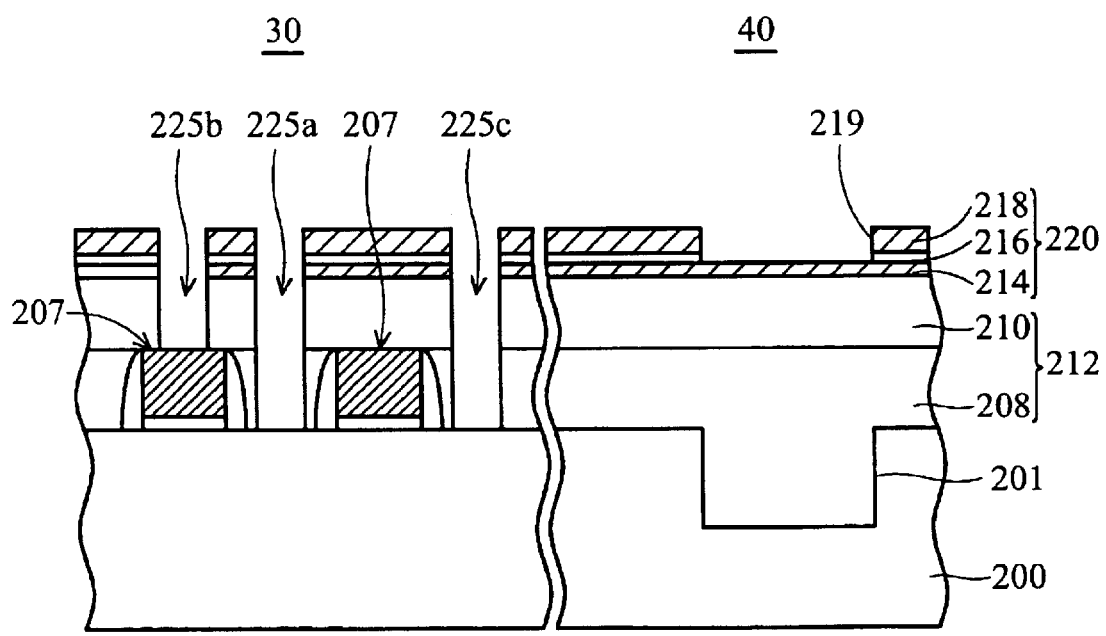

Next, in FIG. 2D, after removing of the photoresist pattern layer 224, the exposed ILD layer 212 on the device region 30 is etched using the patterned multi-layer hard mask 220 as an etch mask to form a bit line contact hole 225a, a gate contact hole 225b, and a substrate contact hole 225c. At the same time, the silicon oxide layer 216 over the opening (alignment mark) 201 on the alignment region 40 is also removed to expose the underlying first polysilicon layer 214. The ILD layer 212 over and in the alignment mark 201 is not etched due to the protection of the first polysilicon layer 214 covered thereon. As a result, the step height on the alignment region 40 can be reduced when the subsequent metal layer is deposited thereon.

Figure 2E:
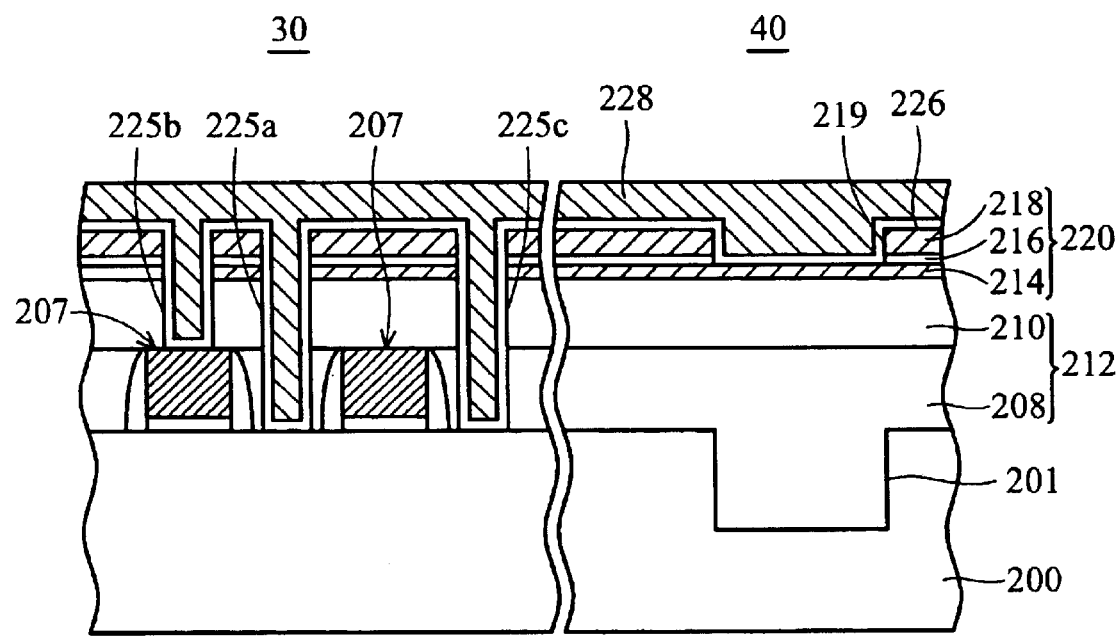

Finally, in FIG. 2E, a barrier layer 226 comprising, for example, titanium and titanium nitride, is conformably formed on the patterned multi-layer hard mask 220 and the inner surfaces of the contact holes 225a, 225b, 225c and the opening 219. Thereafter, a metal layer 228, such as a tungsten layer, is formed on the barrier layer 226 and fills the contact holes 225a, 225b, 225c and the opening 219 to complete the fabrication of the contact plugs. The metal layer 228 is subsequently planarized by CMP. Since the step height on the alignment region 40 is reduced, the dishing effect can be prevented when the metal layer 228 is planarized, thereby preventing disconnection of the metal layer 228 adjacent to the alignment mark 201 on the alignment region 40.

FIG. 2E also illustrates a semiconductor device fabricated using a multi-layer hard mask of an embodiment of the invention. The semiconductor device comprises a substrate 200, an ILD layer 212, a first polysilicon layer 214, a silicon oxide layer 216, a second polysilicon layer 218, a barrier layer 226, and a metal layer 228. The substrate has a device region 30 and an alignment region 40, in which the device region 30 has a plurality of gate structures 207 formed thereon and the alignment region 40 has an opening 201 therein to serve as an alignment mark (AM). Moreover, the gate structure 207 comprises a gate dielectric layer 202, a gate electrode 204, and a gate spacer 206. The ILD layer 212 overlies the substrate 200 and fills the opening 201, in which the ILD layer 212 on the device region 30 has a bit line contact hole. 225a, a gate contact hole 225b, and a substrate contact hole 225c therein. Moreover, the ILD layer 212 may comprise a borophosphosilicate glass (BPSG) layer and a tetraethyl orthosilicate (TOES) oxide layer. The first polysilicon layer 214, the silicon oxide layer 216, and the second polysilicon layer 218 are successively disposed on the ILD layer 212 to serve as the multi-layer hard mask 220, in which the multi-layer hard mask 220 on the device region 30 has a plurality of holes therein to expose the bit line contact hole 225a, the gate contact hole 225b, and the substrate contact hole 225c. Moreover, the multi-layer hard mask 220 over the opening (alignment mark) 201 on the alignment region 40 has another opening 219 therein to expose the first polysilicon layer 214. In this embodiment, the first polysilicon layer 214 has a thickness less than the second polysilicon layer 218. For example, the first polysilicon layer 214 has a thickness of about 300 to 500 Å and the second polysilicon layer 218 has a thickness of about 400 to 600 Å. Moreover, the silicon oxide layer 216 has a thickness of about 100 to 200 Å. The barrier layer 226 comprising, for example, titanium and titanium nitride, is conformably disposed on the multi-layer hard mask 220 and the inner surfaces of the contact holes 225a, 225b, and 225c and the opening 219. The metal layer 228, such as a tungsten layer, is disposed on the barrier layer 226 and fills the contact holes 225a, 225b, and 225c and the opening 219.

According to embodiments of the invention, the thickness of the multi-layer hard mask 220 over the alignment mark 201 can be reduced, eliminating the strongly reflected light from the hard mask 220 to improve lithography during the contact definition. Moreover, since the step height of the metal layer 228 on the alignment region 40 is reduced by the partially recessed multi-layer hard mask 220, the disconnection of the metal layer 228 adjacent to the alignment mark 201 can be prevented after planarization.

While the invention has been described by way of example and in terms of the preferred embodiments, it is to be understood that the invention is not limited to the disclosed embodiments. To the contrary, it is intended to cover various modifications and similar arrangements (as would be apparent to those skilled in the art). Therefore, the scope of the appended claims should be accorded the broadest interpretation to encompass all such modifications and similar arrangements.

What is claimed is:

1. A semiconductor device fabricated using a multilayer hard mask, comprising:

a substrate with a device region and an alignment region having a first opening therein to serve as an alignment mark;

a dielectric layer overlying the substrate and filled in the first opening, wherein the dielectric layer on the device region has a plurality of contact holes therein;

a first polysilicon layer, a silicon oxide layer, and a second polysilicon layer successively disposed on the dielectric layer to serve as the multi-layer hard mask, wherein the multi-layer hard mask on the device region has a plurality of holes therein to expose the contact holes and the multi-layer hard mask over the first opening on the alignment region has a second opening therein to expose the first polysilicon layer;

a barrier layer conformably disposed on the multi-layer hard mask and the inner surfaces of the contact holes and the second opening; and a metal layer disposed on the barrier layer and filling the contact holes and the second opening.

2. The device as claimed in claim 1, wherein the dielectric layer comprising a borophosphosilicate glass or a tetraethyl orthosilicate oxide.

3. The device as claimed in claim 1, wherein the first polysilicon layer has a thickness less than the second polysilicon layer.

4. The device as claimed in claim 1, wherein the thickness of the first polysilicon layer is about 300 to 500 Å and that of the second polysilicon layer is about 400 to 600 Å.

5. The device as claimed in claim 1, wherein the silicon oxide layer has a thickness of about 100 to 200 Å.

6. The device as claimed in claim 1, wherein the contact hole comprises a bit line contact hole, a gate contact hole, or a substrate contact hole.

7. The device as claimed in claim 1, wherein the barrier layer comprises titanium and titanium nitride.

8. The device as claimed in claim 1, wherein the metal layer comprises tungsten.

* * * * *